United States Patent [19]

Fitzner

[11] Patent Number: 4,809,122

[45] Date of Patent: Feb. 28, 1989

[54] SELF-PROTECTIVE FUEL PUMP DRIVER CIRCUIT

[75] Inventor: Arthur O. Fitzner, Fond du Lac, Wis.

[73] Assignee: Brunswick Corporation, Skokie, Ill.

[21] Appl. No.: 80,320

[22] Filed: Jul. 31, 1987

[51] Int. Cl.⁴ .............................................. H02H 3/24
[52] U.S. Cl. ........................................ 361/18; 361/58;
361/86; 361/96; 361/98; 363/56; 323/278;
318/434
[58] Field of Search ......................... 361/18, 30, 33, 31,
361/28, 29, 23, 75, 74, 86, 87, 98, 93, 91, 58, 96;
363/56, 53; 323/276, 278; 318/434, 445

[56] References Cited

U.S. PATENT DOCUMENTS 4,371,824  2/1983  Gritter ................................ 361/18 X
4,595,966  6/1986  Huber et al. ....................... 361/98 X

FOREIGN PATENT DOCUMENTS 2151376  7/1985  United Kingdom ................ 323/276

Primary Examiner—Todd E. DeBoer
Attorney, Agent, or Firm—Andrus, Sceales, Starke & Sawall

[57] ABSTRACT

A self-protective driver circuit with automatic reset features is provided for a marine electric fuel pump (2, 102) energized by the boat battery (4, 104) as controlled by a series connected semiconductor switch (6, 106). A first stage protective subcircuit (28, 128) senses surge current through the semiconductor switch at initial turn on with the fuel pump at rest and causes the semiconductor switch to depart from saturated conduction and thus limit the current until the pump starts running and the current decreases to a safer level, to protect the semiconductor switch from excessive current. A second stage protective subcircuit (36, 136) senses a given minimum current flow through the semiconductor switch in combination with abnormally high conduction voltage across the semiconductor switch, indicating a stalled or electrically shorted fuel pump, and in conjunction with a timer (58, 164) quickly turns OFF the semiconductor switch for a given time interval for cooling-off purposes, after which the semiconductor switch is automatically turned back ON, with the cycle repeating as necessary. A third stage protective subcircuit (82, 184) senses long term increased current flow through the semiconductor switch indicating a deteriorating condition in the fuel pump, and in conjunction with the timer turns OFF the semiconductor switch for the given time interval after which the semiconductor switch is automatically turned back ON to re-energize the fuel pump, the cycle repeating as necessary.

11 Claims, 2 Drawing Sheets

SELF-PROTECTIVE FUEL PUMP DRIVER CIRCUIT

BACKGROUND AND SUMMARY

The present invention relates to self-protecting drive circuitry for electric fuel pumps. The invention arose during development efforts directed to providing a user friendly fuel pump driver circuit for use in a marine drive.

Typically, an electric fuel pump is comprised of a displacement-type pump driven by a DC permanent-magnet motor. Generally there is an integral check valve at the pump outlet to prevent reverse fuel flow through the pump. Also, a pressure regulator external to the pump outlet is normally included to regulate the pressure developed by the pump. The pressure regulator regulates the pressure by providing a pressure relieving bypass path for the excess fuel supplied by the pump, thereby preventing the pressure from rising above the desired value.

The present invention provides a fuel pump drive subsystem that is not only self-protecting but is also user friendly. A series connected semiconductor switch is automatically turned OFF in response to a given sensed abnormal or fault condition, and is automatically turned back ON after a cooling-off interval, thereby re-energizing the fuel pump, all without manual intervention from the operator. The circuitry automatically repeatedly attempts to re-energize the fuel pump while utilizing current-limiting and cooling-off intervals to protect itself. Experience has shown that these repeated re-energization attempts can actually dislodge particles of metal or rubber which may be caught in the fuel pump, and after the particle is dislodged, the pump starts running normally again.

The invention provides various stages of protection for the semiconductor driving the pump. In the preferred embodiment, a first protective stage, which is designed to sense high current through the semiconductor switch, typically senses high current occurring at initial turn-on and quickly reduces the drive signal to the semiconductor. During such reduced drive signal conditions the semiconductor does not act like a switch, but rather functions as an active current-controlling element in series with the fuel pump. The first protective stage is fast-acting and provides effective current-limiting to protect the semiconductor switch from excessive current.

A second protective stage senses abnormally high voltage across the semiconductor switch in combination with current flow through the semiconductor switch in excess of a given minimum current. Such a combination of conditions usually indicates a load fault, such as a stalled or shorted pump, that could damage the semiconductor switch if it were to remain turned ON for any significant period of time. Without counter EMF from a stalled or shorted pump there would be excessive power dissipation in the semiconductor switch. If the second protective stage detects conditions indicative of a load fault, the second protective stage quickly triggers a timer which turns OFF the semiconductor switch for a cooling-off interval. At the end of the cooling-off interval the semiconductor switch is automatically turned back ON again.

A third protective stage senses long term above-normal current flow through the semiconductor switch, symptomatic of a developing problem. The problem could be within the fuel pump itself, such as gum or varnish deposits or bearings beginning to seize, or external to the pump such as a pressure regulator stuck in the closed position, clogged fuel passages in the outlet line leading away from the pump, etc. Any of these conditions would cause the pump motor to labor against an abnormally high torque load, which would slow down the motor and increase its current demand. Should the condition continue to worsen, the dissipation in the semiconductor switch would continue to increase. Eventually the condition could deteriorate to the point that the semiconductor switch would overheat and fail. The third protective stage therefor monitors the current through the semiconductor switch, and when above-normal current has existed for a sufficient period of time, the third protective stage detects it and triggers the timer which turns OFF the semiconductor switch for a given cooling-off interval, after which it is automatically turned back ON again.

No matter which level of protection is activated, there is no need for the boat operator to go through a reset procedure, whether by the ignition key, reset button, etc. Instead, the protection circuitry automatically repeatedly attempts to re-energize the fuel pump.

DETAILED DESCRIPTION

Figure 1:
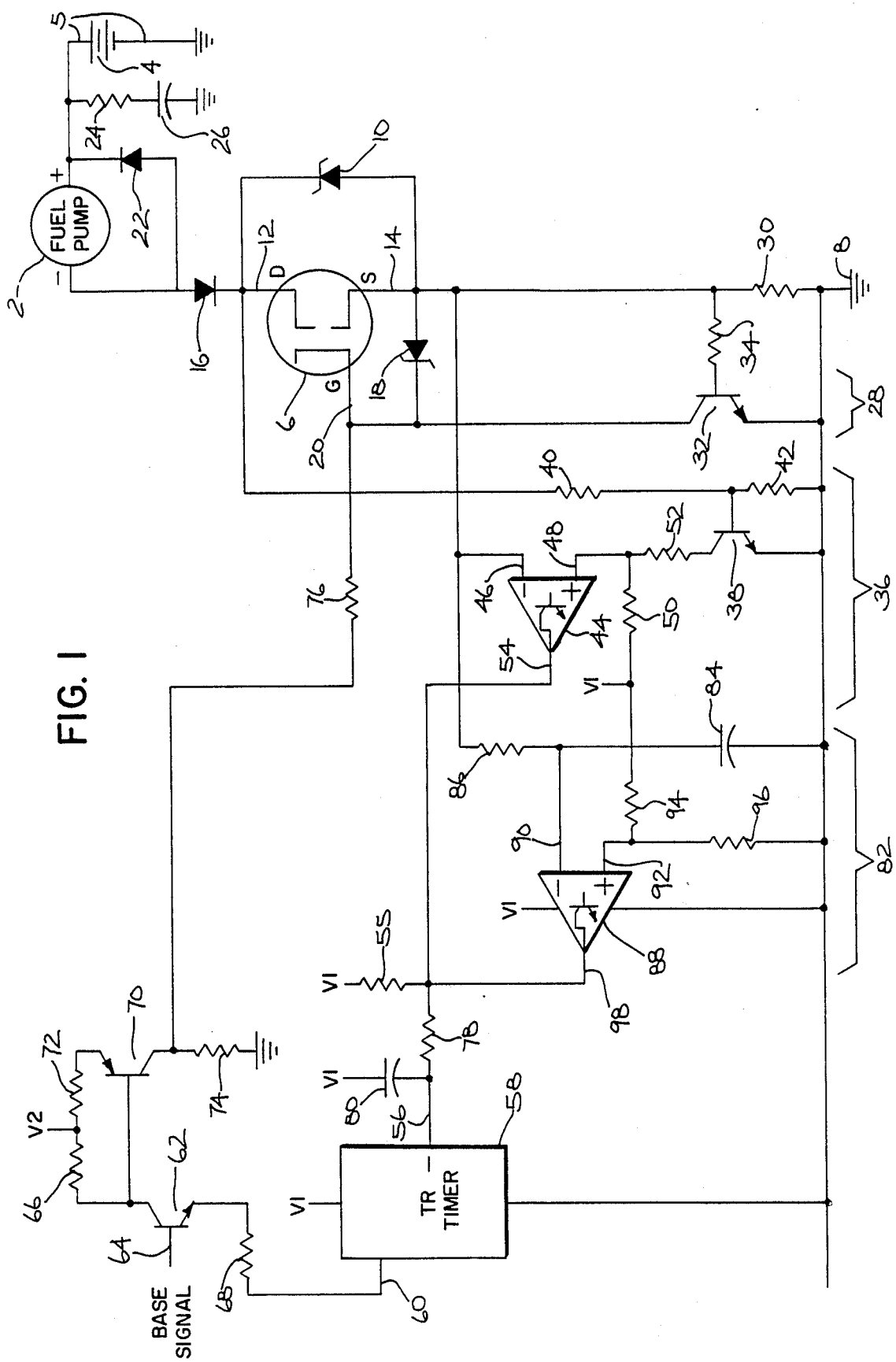
FIG. 1 is a circuit diagram showing a self-protective fuel pump driver circuit in accordance with the invention.

FIG. 1 shows a self-protective circuit for a marine drive electric fuel pump 2, such as a Mercury Marine 1987 Model 220 EFI outboard engine fuel pump, energized by electrical potential provided by the boat battery 4 via conductors 5. A semiconductor switch 6 is connected in series with fuel pump 2 and has an ON state conducting current and completing a current path from battery 4 through fuel pump 2 and semiconductor switch 6 to ground reference at 8, to energize the fuel pump. Semiconductor switch 6 has an OFF state blocking current flow, to de-energize the fuel pump. Semiconductor switch 6 is an MTP25N06 N-channel MOSFET. A protective zener diode 10 is connected in parallel with the MOSFET between its main terminals at drain 12 and source 14, to protect the MOSFET from drain-to-source overvoltage. Series diode 16 is provided for reverse battery protection. This is considered necessary in marine applications because the boat owner typically removes and then reinstalls the battery many times over a life of intermittent usage. Zener diode 18 provides gate-to-source overvoltage protection for the MOSFET and is connected between gate terminal 20 and source terminal 14. MOSFET 6 has the ability to turn off very rapidly and can generate high turn-off transient voltages if inductive discharge current paths are not provided. Diode 22 provides a discharge path through which the current in the inductance of fuel pump 2 can decay. Resistor 24 and capacitor 26 provide a discharge path through which the current that had been flowing through the inductance of the long conductors 5 from battery 4 to fuel pump 2 can decay.

A first stage protective subcircuit 28 is connected as a conventional current-limiting circuit. When fuel pump 2 is at rest, at the initial turn-on of MOSFET 6 the current flowing through MOSFET 6 rapidly increases toward damaging levels. Protective subcircuit 28 senses high current and quickly reduces the signal on gate 20 of MOSFET 6 to take MOSFET 6 out of saturation and into an unsaturated mode of operation, thereby limiting the current and protecting MOSFET 6 from excessive current density which might damage the silicon semiconductor material. A current sensing resistor 30 is connected in series with MOSFET 6. In the disclosed embodiment, resistor 30 has a resistance of 0.04 ohms and provides a voltage drop thereacross of 0.6 volts at 15 amps. The voltage source 4 is a 12 volt battery, and fuel pump 2 typically draws about 5 amps in normal operation. MOSFET 6 is rated at 25 amps, 60 volts. An NPN bipolar transistor 32 has its base-emitter circuit connected across current sensing resistor 30 and is base driven into collector-emitter conduction when the voltage across resistor 30 reaches or exceeds approximately 0.6 volts. The collector of transistor 32 is connected to MOSFET gate terminal 20. Upon conduction in transistor 32 the gate voltage on MOSFET 6 is lowered. With lowered gate voltage, MOFET 6 comes out of saturation and the current, through MOSFET 6 becomes essentially a function of the voltage on the gate terminal 20 relative to the source terminal 14 of MOSFET 6. As a result the peak surge current through MOSFET 6 is limited to a safe value. Resistor 34 provides protection against momentary excessive base current in transistor 32. Subcircuit 28 is fast acting and provides current limiting for MOSFET 6. As the fuel pump comes up to speed the current flow through MOSFET 6 decreases, the voltage across resistor 30 decreases and transistor 32 turns OFF, whereby MOSFET 6 may again be driven into saturated conduction.

A second stage protective subcircuit 36 is designed to effectively sense a voltage in excess of the normal full load saturation voltage across MOSFET 6 when the current flowing through MOSFET 6 is above a given minimum level. These conditions generally indicate a stalled or shorted pump, but could also indicate any condition where the pump is so heavily loaded that it runs at far less than normal speed. When such conditions have existed for a period of about 100 microseconds, a shutdown timer 58 is triggered and causes MOSFET 6 to turn OFF for a given cooling-off interval. Subcircuit 36 includes NPN bipolar transistor 38, provided by a 2N4401 transistor, base driven into conduction by the voltage developed across MOSFET 6 and resistor 30, as applied to the base by the voltage divider network formed by resistors 40 and 42. Subcircuit 36 also includes a comparator 44, provided by a 2903 comparator, having an inverting input 46 connected to current sensing resistor 30 for sensing a given minimum current flow through the MOSFET. Comparator 44 has a noninverting input 48 connected through resistor 50 to positive polarity voltage source V1 such that noninverting input 48 is normally high. Noninverting input 48 is also connected through resistor 52 to the collector of transistor 38. The emitter of transistor 38 is connected to ground reference 8. During normal operation of the fuel pump, whenever MOSFET 6 is ON and conducting current the voltage across MOSFET 6 is the normal low saturation voltage and therefor transistor 38 is not turned on and noninverting input 48 of comparator 44 is high relative to inverting input 46. Conversely, when MOSFET 6 is OFF and not conducting current, the voltage drop across MOSFET 6 is high and transistor 38 is turned on, which reduces the voltage on noninverting input 48 to a low level determined primarily by resistors 50 and 52. However, noninverting input 48 is still high in relation to input 46 because the latter input is at ground potential, indicative of the zero current flow through current sensing resistor 30.

Comparator output 54 is connected to the inverting trigger input 56 of a timer 58, provided by a 555 timer. Normally, when inverting input 56 is high, the output 60 of the timer is low, which low state enables conduction of NPN bipolar transistor 62, provided by a 2N4401 transistor. Transistor 62 can then be driven into conduction by a signal at base 64 supplied as pulses according to fuel demand, or cyclically supplied according to a duty cycle, or continuously supplied. Conduction of transistor 62 completes a circuit from voltage source V2 through resistors 66 and 68 to low output 60. Conduction of transistor 62 causes a forward bias to appear on the base of PNP bipolar transistor 70, provided by a 2N4403 transistor, driving transistor 70 into conduction, which in turn completes a circuit from voltage source V2 through resistors 72 and 74 to ground, and provides the gate drive signal for MOSFET gate 20 through protective resistor 76.

Subcircuit 36, which includes comparator 44, is provided to sense abnormally high power dissipation in MOSFET 6, indicative of a faulty condition in fuel pump 2 or its wiring, by turning on output 54 of comparator 44 as follows. When no fuel pump current is flowing through MOSFET 6 there is no power dissipation in MOSFET 6, and the inputs of comparator 44 must receive voltages that maintain comparator output 54 non-conductive. Likewise, when a normal fuel pump current flows through MOSFET 6 accompanied by a normal low saturation voltage between MOSFET terminals 12 and 14, the inputs of comparator 44 must continue to receive voltages that maintain comparator output 54 in the non-conducting state. It is only when abnormally high current begins to flow through MOSFET 6 that the MOSFET would be unable to maintain a low saturation voltage between terminals 12 and 14. It is the combination of current flowing through the MOSFET and the abnormally high voltage across the MOSFET that puts it in danger of overheating. Subcircuit 36 is therefor provided to detect above-normal saturation voltge across MOSFET 6, but only when MOSFET 6 has been turned on, as indicated by a flow of current through MOSFET 6 in excess of a selected minimum value.

Under the condition of zero current and zero power dissipation in MOSFET 6, transistor 38 will be turned on because the large voltage drop between drain 12 and source 14 of non-conducting MOSFET 6, plus the zero voltage drop across sensing resistor 30, is more than sufficient to turn on transistor 38 via voltage dividing resistors 40 and 42. Because transistor 38 is on, input 48 of comparator 44 receives a small positive voltage, essentially the supply voltage V1 reduced by the voltage divider comprised of resistors 50 and 52. In comparison, input 46 of comparator 44 receives zero voltage, indicative of zero fuel pump current flowing through MOSFET 6, as sensed by current sensing resistor 30. Because input 48 is more positive than input 46, the output 54 of comparator 44 will be held in the required non-conducting state.

Under the condition of normal current, normal saturation voltage drop and normal power dissipation in MOSFET 6, input 46 of comparator 44 receives a small voltage representative of the normal fuel pump current flowing through MOSFET 6, as sensed by sensing resistor 30. Input 48 receives a much higher voltage, namely the voltage V1, because the low saturation voltage from drain 12 to source 14 of MOSFET 6 when it is fully turned on, added to the small voltage drop across current sensing resistor 30, is insufficient to turn on transistor 38 via the voltage dividing resistors 40 and 42. Thus comparator 44 continues to remain with its output 54 in the required non-conducting state.

When abnormally high current flows MOSFET 6 is no longer able to maintain a low saturation voltage between terminals 12 and 14, especially if current-limit transistor 32 has reduced the voltage on gate 20 of MOSFET 6, and abnormally high power dissipation in MOSFET 6 develops. Under this condition the abnormally high voltage across MOSFET 6, added to the small, relatively insignificant voltage drop across sensing resistor 30, would be large enough to turn on transistor 38. With transistor 38 turned on, the voltage on comparator input 48 would be reduced to a small value, lower than the voltage on input 46 which is receiving the voltage developed across current sensing resistor 30. Consequently, output 54 of comparator 44 would switch to its conducting state.

Normally, comparators 44 and 88 hold their paralleled respective outputs 54 and 98 in a non-conducting state, and thus pull-up resistor 55 normally maintains the voltage level at both outputs at the logic high level of positive supply voltage V1. The voltage level at the paralleled outputs is connected to the input of an RC filter formed by resistor 78 and capacitor 80. When either one of the comparators 44 or 88 suddenly switches its output to the conducting state, such as was described previously in connection with comparator 44, both outputs as well as the input to the RC filter are driven to a logic low level, to essentially zero volts. The sudden appearance of a logic low voltage at the input of the RC filter causes an apparent logic low voltage to appear at the output of the RC filter about 100 microseconds later. The output of the RC filter circuit is connected to the negative-going level-triggering input 56 of timer 58. The appearance of the logic low voltage at the RC filter output and at input 56 triggers the timer 58, which then drives its output 60 high for a period of about 1½ to 2 seconds. The high state at output 60 prevents conduction of transistor 62, which turns OFF transistor 70, which removes the gate drive voltage at gate terminal 20 and turns OFF MOSFET 6. For the remainder of the 1½ to 2 seconds during which timer 58 times out, MOSFET 6 will be non-conducting and will therefor cool off. After the two second cooling-off period, timer output 60 goes low, which allows transistors 62 and 70 and MOSFET 6 to be turned back ON by the input signal on base 64.

In the manner just described, subcircuit 36, in cooperation with timer 58 and other circuit elements, is able to quickly sense a fault condition in fuel pump 2 or the wiring thereto, and is able to initiate a cooling-off period for MOSFET 6 during which the fuel pump is deengerized. After the cooling-off interval provided for MOSFET 6, if the controlling signal on base 64 calls for energization of the fuel pump, MOSFET 6 will be allowed to turn back ON again. If the fault condition is still present subcircuit 36 will again detect it and quickly initiate another cooling-off interval before MOSFET 6 can overheat. All of the foregoing actions take place without requiring any manual intervention on the part of the operator.

The RC filter comprised of resistor 78 and capacitor 80 enables timer 58 to ignore momentary false indications from subcircuit 36. With normal conditions in the fuel pump 2 and wiring thereto, when MOSFET 6 turns OFF or turns ON there may be very short periods during which the output 54 of comparator 44 becomes conductive. Because of the RC filtering action, timer 58 will not respond to such momentary false fault indications. In the disclosed embodiment, the base drive voltage for transistor 38 is sensed across MOSFET 6 and resistor 30. Alternatively, such voltage can be sensed solely across MOSFET 6.

A third stage protective subcircuit 82 senses long term increasd current flow through MOSFET 6 indicating a deteriorating condition in the fuel pump or the like, and in conjuction with timer 58 turns OFF MOSFET 6 for the given two second cooling-off interval, after which MOSFET 6 is automatically turned back ON if called for by base signal 64. Subcircuit 82 includes a capacitor 84 charged through resistor 86 and selected to ignore the above noted current surge at the initial turn-on, but to become sufficiently charged to a given threshold when the normal steady state ON current reaches a level of about 10 amps. Subcircuit 82 includes a comparator 88, provided by a 2903 comparator, having an inverting input 90 connected to the junction of resistor 86 and capacitor 84. Comparator 88 has a noninverting input 92 connected to a given reference and biased to a given level, which in the disclosed embodiment is 0.4 volts, by voltage source V1 and the voltage divider network provided by resistors 94 and 96.

During the normal ON state of MOSFET 6 and normal operation of fuel pump 2, the voltage level at comparator input 90 is lower than that at input 92, and comparator output 98 is non-conducting and is normally high as biased through pull-up resistor 55 to voltage source V1. Comparator output 98 is connected to inverting timer input 56 via the aforementioned RC filter comprised of resistor 78 and capacitor 80. When comparator output 98 is high, timer output 60 is normally low thereby enabling the signal on base 64 to produce gate drive to MOSFET gate 20. If the fuel pump gradually slows down due to the build-up of gum deposits, etc., current flow through MOSFET 6 gradually increases because of the gradually decreasing counter EMF of the fuel pump, and the voltage across current sensing resistor 30 gradually increases. When capacitor 84 charges above the threshold level of 0.4 volts, the voltage level at comparator input 90 becomes greater than that at input 92, and comparator output 98 goes low. This low signal is effectively delayed by 100 microseconds by the RC filter network provided by resistor 78 and capacitor 80. The low signal at inverting timer input 56 causes timer output 60 to go high which in turn disables conduction of transistors 62 and 70 and hence removes the gate drive for MOSFET gate 20, turning OFF MOSFET 6. After the two second delay, timer output 60 goes back low, enabling conduction in transistors 62 and 70, and hence enabling the gate drive circuit for MOSFET gate 20. If the input signal on base 64 calls for energization of the fuel pump at that time, MOSFET 6 will receive gate drive and will turn ON.

Figure 2:
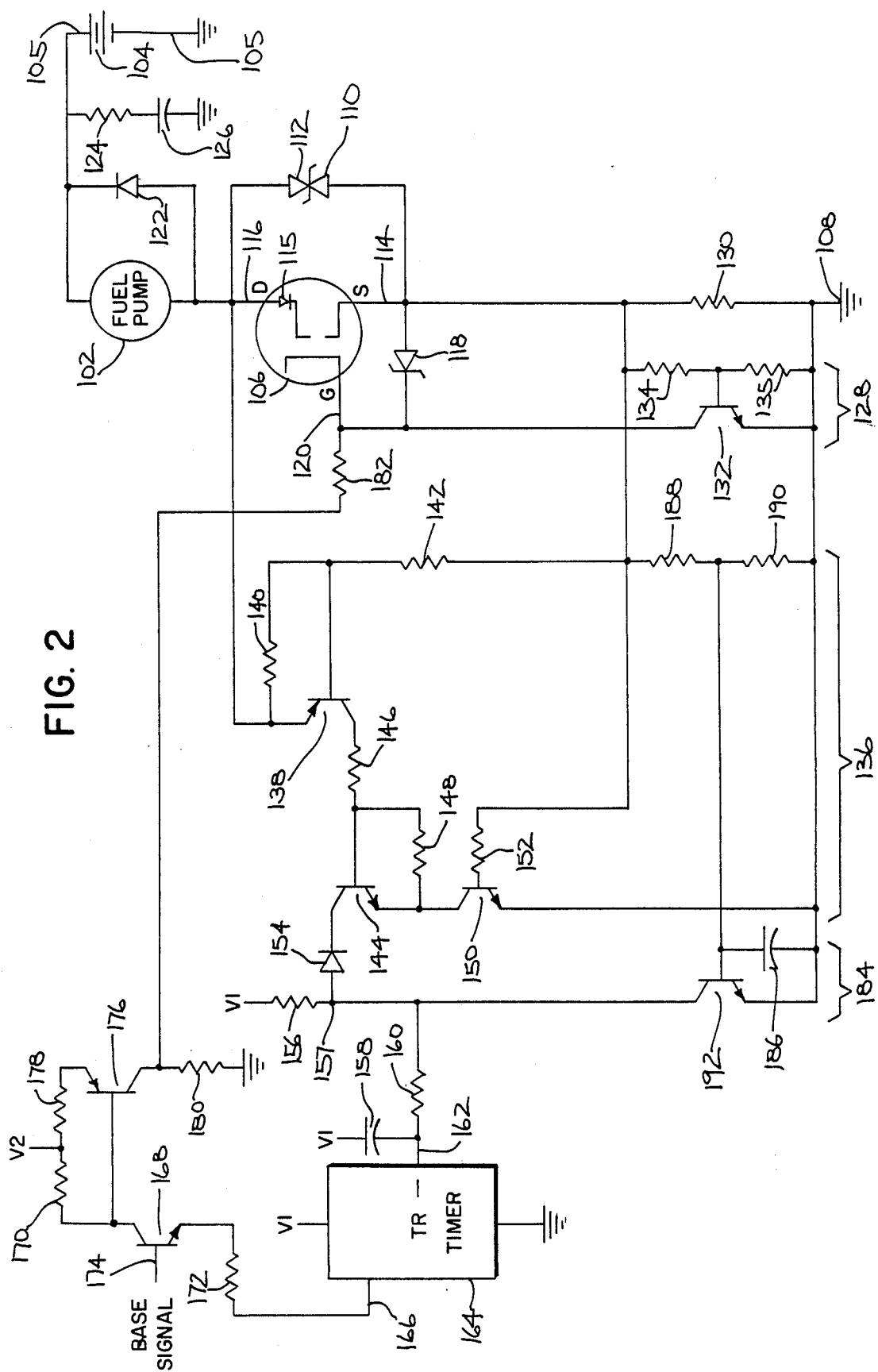
FIG. 2 is a circuit diagram showing another embodiment of a self-protective fuel pump driver circuit in accordance with the invention.

FIG. 2 shows an alternate embodiment of a self-protective circuit for a marine electric fuel pump 102 energized by a source of electrical potential provided by the boat battery 104 via cables 105. A semiconductor switch is provided by GEMFET 106 connected in series with fuel pump 102 and battery 104. GEMFET 106 has an ON state conducting current and completing a current path from battery 104 through fuel pump 102 to ground reference 108 to energize fuel pump 102. GEMFET 106 has an OFF state blocking current flow, to de-energize fuel pump 102. GEMFET 106 has an internal junction layer that acts as a series-connected diode, shown symbolically as diode 115. The internal junction layer, symbolized by diode 115, provides inherent protection to GEMFET 106 against reversed installation of the battery.

A pair of zener diode chips 110 and 112 are connected in series opposition within the same housing and the overall assembly is connected across the respective main terminals of GEMFET 106 at source 114 and drain 116, to be in parallel with the GEMFET and provide drain to source and source to drain overvoltage protection and to preserve reversed battery installation polarity protection. Zener diode 118 is connected between GEMFET gate terminal 120 and source terminal 114 and provides gate to source overvoltage protection. A snubber circuit is provided by diode 122, resistor 124 and capacitor 126 and diverts turn-off current therethrough from the inductance provided by fuel pump 102 and the inductance provided by long battery cables 105 upon turn-off of GEMFET 106, to dissipate turn-off energy.

A first stage protective subcircuit 128 includes a current sensing resistor 130 connected in series between GEMFET source terminal 114 and ground reference 108. Subcircuit 128 also includes NPN bipolar transistor 132 having its collector connected to GEMFET gate terminal 120, and its emitter connected to ground reference 108. Transistor 132 is base driven into conduction by the voltage developed across resistor 130 as reduced by the voltage divider network provided by resistors 134 and 135. Subcircuit 128 functions comparably to subcircuit 28 in FIG. 1. Conduction in transistor 132 lowers the gate drive voltage at GEMFET gate 120 below the fully saturated turn-on level for GEMFET 106, to partially turn-off GEMFET 106 thereby limiting the surge current until the surge current decreases to a more normal level. Subcircuit 128 provides fast-acting current limiting.

A second stage protective subcircuit 136 functions comparably to subcircuit 36 in FIG. 1. PNP bipolar transistor 138 operates comparably to transistor 38 in FIG. 1. Transistor 138 is turned on by a given abnormally high conduction voltage across GEMFET 106 as reduced by the voltage divider network provided by resistors 140 and 142. Transistor 138 is of course also turned on when GEMFET 106 is turned OFF and the voltage from drain 116 to source 114 is equal to the battery voltage. NPN bipolar transistor 150 is connected to GEMFET source terminal 114 through protective resistor 152 and is turned on by a given minimum current flow through GEMFET 106 developing a voltage across resistor 130. This minimum current flow function for the ON state of the GEMFET is similar to the minimum current flow function provided by comparator input 46 in FIG. 1. NPN bipolar transistor 144 is driven into conduction only when transistors 138 and 150 are both turned on. Transistor 150, when turned on in response to a current in GEMFET 106 above a given minimum value, acts to connect the emitter terminal of transistor 144 to ground reference 108. Transistor 138, when turned on in response to an abnormally high conduction voltage across GEMFET 106, attempts to supply base current through resistor 146 to transistor 144. With both transistors 138 and 150 turned on, a condition indicative of a fault in fuel pump 102 or the wiring thereto leading to abnormally high power dissipation in GEMFET 106, transistor 144 will be turned on. The collector of transistor 144 is connected through diode 154 to drive pull-up resistor 156 to a low voltage. Normally, the voltage at the driven end of resistor 156 at node 157 would be high but when transistor 144 is turned on the voltage at node 157 is pulled low. This voltage is the input voltage to an RC filter provided by resistor 160 and capacitor 158, where the output of the RC filter drives inverting triggering input 162 of timer 164, provided by a 555 timer. Under normal operation of the fuel pump 102, that is, without the simultaneous conditions of current flowing through GEMFET 106 above a minimum value and abnormally high conduction voltage across GEMFET 106, which are the conditions to turn on the two transistors 150 and 138, respectively, the voltage at the input of the RC filter at node 157 is high. Under the condition described above, however, wherein the transistors 150 and 138 are both turned on, transistor 144 will also turn on and will drive the input voltage to the RC filter at node 157 low. After a delay of about 100 microseconds the logic low level at the filter input will propagate through the filter and appear on triggering input 162, thereby triggering timer 164. Under normal conditions, transistor 144 may be turned on falsely for very short periods of time as GEMFET 106 switches ON and OFF. The RC filter provided by resistor 160 and capacitor 158 rejects momentary false low voltage pulses at the filter input by not passing them through to the filter output, thus preventing timer 164 from being triggered incorrectly by momentary false operation of transistor 144. With the timer 164 not triggered and not timing out, timer output 166 will be low which, when combined with a base drive signal at input 174 will cause NPN bipolar transistor 168 to conduct current from voltage source V2 through resistors 170 and 172. Conduction of transistor 168 drives PNP bipolar transistor 176 into conduction which in turn completes a circuit from voltage source V2 through resistors 178 and 180 to ground, thereby providing gate drive voltage for GEMFET 106 through protective resistor 182.

With transistor 150 turned on but transistor 138 turned off some leakage current may continue to flow from transistor 138 and therefor a bypass path to divert the leakage current around the base-emitter junction of transistor 144 is provided by resistor 148. Conversely, when transistor 138 is turned on but transistor 150 is turned off, transistor 138 would attempt to send current into the base of transistor 144 which would emerge, were it not for blocking diode 154, from the collector terminal of transistor 144 and raise the voltage on timer input 162 and on filter capacitor 158, thereby increasing the effective delay through the RC filter. To prevent current from flowing out of the collector terminal of transistor 144, blocking diode 154 is provided.

Upon abnormally high conduction voltage across GEMFET 106 and at least a given minimum current flow therethrough, all three transistors 138, 144 and 150 become conductive. Conduction of series connected transistors 144 and 150 completes a circuit from timer input 162 through resistor 160 and diode 154, through transistors 144 and 150 to ground reference 108. After a delay of about 100 microseconds provided by resistor 160 and capacitor 158, the voltage at timer inverting input 162 is reduced to a logic low level which triggers timer 164. Timer output 166 goes high and remains high for a given selectable set timing interval, preferably chosen to be 1½ to 2 seconds as in FIG. 1. The high state at timer output 166 disables conduction of transistor 168, which disables conduction of transistor 176, which disables the gate drive for GEMFET gate 120, turning GEMFET 106 OFF. At the end of the two second cooling-off time interval, timer output 166 goes back low. With output 166 low, and with the presence of a high signal at input 174, conduction is enabled in transistor 168, which enables conduction of transistor 176, which enables the gate drive for GEMFET 120, turning GEMFET 106 back ON.

A third protective subcircuit 184 includes a transistor 192 which has its base connected to capacitor 186 which is charged to a voltage representative of the current through GEMFET 106, as developed across current sensing resistor 130 and as reduced by voltage dividing resistors 188 and 190. Capacitor 186 in conjunction with voltage dividing resistors 188 and 190 provides filtering of the voltage appearing at the base of transistor 192. During the normal current surge at initial turn ON of GEMFET 106, the filtering provided by capacitor 186 and resistors 188 and 190 prevents transistor 192 from turning ON. Subcircuit 184 functions comparably to subcircuit 82 in FIG. 1. Subcircuit 184 senses long term increased current flow through GEMFET 106 indicating a deteriorating condition in the fuel pump or the like, and in conjunction with timer 164 turns OFF GEMFET 106 for a given cooling-off interval, after which if base signal 174 is present, GEMFET 106 is automatically turned back on again. If the voltage on capacitor 186 is above a given threshold voltage, GEMFET 106 is turned OFF, comparably to FIG. 1 wherein the voltage above the threshold on capacitor 84 is able to turn off MOSFET 6. Bipolar NPN transistor 192 has its collector connected to node 157, and its emitter connected to ground reference 108. Transistor 192 is base driven into conduction when capacitor 186 is charged above a given threshold, thereby providing sufficient base-emitter voltage to turn on transistor 192. Conduction in transistor 192 completes a circuit to trigger timer 164 by providing a current path from timer inverting input 162 through resistor 160 through transistor 192 to ground reference 108. The triggering of timer 164 is delayed by about 100 microseconds by the RC filter action provided by resistor 160 and capacitor 158. After being triggered, timer output 166 goes high, which turns off transistor 168, which disables conduction in transistor 176, which turns off the gate drive signal at GEMFET gate 120, thereby turning OFF GEMFET 106. After the two second time interval, timer output 166 goes back low, and if a base drive signal is present at the input 174, current again flows in transistor 168, which enables conduction in transistor 176, which again provides gate drive to GEMFET gate 120, thereby turning GEMFET 106 back ON.

It is recognized that various equivalents, alternatives and modifications are possible within the scope of the appended claims.

I claim:

1. A self-protective circuit including a fuel pump energized by a source of electrical potential, comprising semiconductor switch means in series with said fuel pump and said source of electrical potential, said semiconductor switch means having an ON state conducting current and completing a current path from said source of electrical potential through said fuel pump to energize said fuel pump, said semiconductor switch means having an OFF state blocking current to de-energize said fuel pump, and self-protective subcircuit means sensing abnormal conditions of voltage and current or current alone in said semiconductor switch means indicating a probable faulty condition in said fuel pump and turning OFF said semiconductor switch means to de-energize said fuel pump for a cooling-off interval for said semiconductor switch means, and automatically turning said semiconductor switch means back ON after said cooling-off interval to re-energize said fuel pump, without manual intervention by the operator, wherein said self-protective subcircuit means includes overvoltage sensor means sensing abnormal voltage across said semiconductor switch means while current is flowing therethrough, and overcurrent sensor means sensing abnormal current flow through said semiconductor switch means, and wherein:

said overvoltage sensor means comprises a transistor having base drive voltage developed across said semiconductor switch means to bias said transistor into conduction, and means sensing current flow through said semiconductor switch means and operatively coupled to said transistor such that if the sensed current flow through said semiconductor switch means is above a given minimum current flow then conduction of said transistor turns OFF said semiconductor switch means;

said overcurrent sensor means comprises a capacitor charged by current through said semiconductor switch means such that if said capacitor is charged above a given threshold voltage said overcurrent sensor means turns OFF said semiconductor switch means;

said overvoltage sensor means comprises a comparator having inverting and noninverting inputs, one of said inputs being connected to said transistor, the other of said inputs being connected to said semiconductor switch means, said comparator having an output disabling gate drive for said semiconductor switch means in response to a given overvoltage across said semiconductor switch means causing conduction of said transistor as sensed by said one input of said comparator means if there is said minimum current flow through said semiconductor switch means as sensed by said other input of said comparator means;

said overcurrent sensor means comprises a second comparator having inverting and non-inverting inputs, one of said inputs of said second comparator being connected to said capacitor, the other of said inputs of said second comparator being connected to a given reference, said second comparator having an output disabling said gate drive for said semiconductor switch means in response to long term increased current flow through said semiconductor switch means charging said capacitor above said given threshold.

2. The invention according to claim 1 comprising timer means connected to the output of said first mentioned comparator and triggered thereby to disable the gate drive for said semiconductor switch means for a set time interval, after which said semiconductor switch means is automatically turned back ON, and wherein said timer means is also connected to the output of said second comparator and triggered thereby to disable the gate drive for said semiconductor switch means for a set time interval, after which said semiconductor switch means is automatically turned back ON.

3. A self-protective circuit including a fuel pump energized by a source of electrical potential, comprising semiconductor switch means in series with said fuel pump and said source of electrical potential, said semiconductor switch means having an ON state conducting current and completing a current path from said source of electrical potential through said fuel pump to energize said fuel pump, said semiconductor switch means having an OFF state blocking current to de-energize said fuel pump, and self-protective subcircuit means sensing abnormal conditions of voltage and current or current alone in said semiconductor switch means indicating a probable faulty condition in said fuel pump and turning OFF said semiconductor switch means to de-energize said fuel pump for a cooling-off interval for said semiconductor switch means, and automatically turning said semiconductor switch means back ON after said cooling-off interval to re-energize said fuel pump, without manual intervention by the operator, wherein said self-protective subcircuit means includes overvoltage sensor means sensing abnormal voltage across said semiconductor switch means while current is flowing therethrough, and overcurrent sensor means sensing abnormal current flow through said semiconductor switch means, and wherein;

said overvoltage sensor means comprises a transistor having base drive voltage developed across said semiconductor switch means to bias said transistor into conduction, and means sensing current flow through said semiconductor switch means and operatively coupled to said transistor such that if the sensed current flow through said semiconductor switch means is above a given minimum current flow then conduction of said transistor turns OFF said semiconductor switch means;

said overcurrent sensor means comprises a capacitor charged by current through said semiconductor switch means such that if said capacitor is charged above a given threshold voltage said overcurrent sensor means turns OFF said semiconductor switch means;

said overvoltage sensor means comprises a second transistor base driven into conduction by conduction of said first mentioned transistor, and a third transistor base driven into conduction by said minimum current flow through said semiconductor switch means, said second and third transistors being connected in series and completing a circuit to disable gate drive for said semiconductor switch means;

said overcurrent sensor means comprises a fourth transistor base driven into conduction by said capacitor charged above said given threshold, conduction of said fourth transistor completing a circuit to disable said gate drive for said semiconductor switch means;

4. The invention according to claim 3 comprising timer means triggered by conduction of said second and third transistors in series and disabling said gate drive for said semiconductor switch means for a set time interval, thereby turning OFF said semiconductor switch for said set time interval, after which said semiconductor switch means is automatically turned back ON, said timer means also being triggered by conduction of said fourth transistor to disable said gate drive and thereby turn OFF said semiconductor switch means for said set time interval, after which said semiconductor switch means is automatically turned back ON.

5. A self-protective circuit including a fuel pump energized by a source of electrical potential, comprising:

semiconductor switch means in series with said fuel pump and said source of electrical potential, said semiconductor switch means having an ON state conducting current and completing a current path from said source of electrical potential through said fuel pump to energize said fuel pump, said semiconductor switch means having an OFF state blocking current flow to de-energize said fuel pump, said semiconductor switch means has a pair of main terminals connected in series with said fuel pump and said source of electrical potential and a gate terminal for applying a gate drive bias to turn ON said semiconductor switch means;

overcurrent sensor means sensing initial surge current through said semiconductor switch means at initial turn-on of said semiconductor switch means, and decreasing the conductivity of said semiconductor switch means to limit said surge current to a given maximum level, to protect said semiconductor switch means from excessive current density said overcurrent sensor means comprises a current sensing resistor connected in series with said main terminals of said semiconductor switch means, and a transistor having base drive voltage developed across said current sensing resistor to bias said transistor into conduction, said transistor being connected to said gate terminal of said semiconductor switch means such that conduction of said transistor lowers said gate drive bias for said semiconductor switch means;

overvoltage and minimum current flow sensor means sensing a given minimum current flow through said semiconductor switch means in combination with abnormal voltage across said semiconductor switch means indicating a probable faulty condition in said fuel pump and turning OFF said semiconductor switch means to de-energize said fuel pump to provide a cooling-off interval for said semiconductor switch means and automatically turning said semiconductor switch means back ON after said cooling-off interval to re-energize said fuel pump, all without manual intervention by the operator, said overvoltage and minimum current flow sensor means comprises a second transistor having base drive voltage developed across said semiconductor switch means to bias said second transistor into conduction, and means sensing current flow through said semiconductor switch means and operatively coupled to said second transistor such that if the sensed current flow through said semiconductor switch means is above said minimum current flow then conduction of said second transistor turns OFF said semiconductor switch means;

timer means triggered by conduction of said second transistor if said sensed current flow through said semiconductor switch means is above said minimum current flow, said timer means disabling said gate drive for said semiconductor switch means for a set time interval, after which said semiconductor switch means is turned back ON.

6. The invention according to claim 5 wherein said overvoltage and minimum current flow sensor means comprises a comparator having an inverting and a non-inverting input, one of said inputs being connected to said second transistor, the other of said inputs being connected to said semiconductor switch means, said comparator having an output connected to said timer means, such that said output triggers said timer means in response to a given overvoltage across said semiconductor switch means causing conduction of said second transistor as sensed by said one input of said comparator means if there is said minimum current flow through said semiconductor switch means as sensed by said other input of said comparator means.

7. The invention according to claim 5 wherein said overvoltage and minimum current flow sensor means comprises a third transistor base driven into conduction by conduction of said second transistor, and a fourth transistor base driven into conduction by said minimum current flow through said semiconductor switch means, said third and fourth transistors being connected in series and completing a circuit to said timer means upon conduction of each of said third and fourth transistors, to trigger said timer means.

8. A self-protective circuit including a fuel pump energized by a source of electrical potential, comprising:

semiconductor switch means in series with said fuel pump and said source of electrical potential, said semiconductor switch means having an ON state conducting current and completing a current path from said source of electrical potential through said fuel pump to energize said fuel pump, said semiconductor switch means having an OFF state blocking current flow to de-energize said fuel pump, said semiconductor switch means has a pair of main terminals connected in series with said fuel pump and said source of electrical potential and has a gate terminal for applying gate drive bias to turn ON said semiconductor switch means;

a first stage protective subcircuit sensing the initial surge current through said semiconductor switch means at turn-on of said semiconductor switch means, and decreasing the conductivity of said semiconductor switch means to limit said surge current to a given maximum level, to protect said semiconductor switch means from excessive current density, said first stage protective subcircuit comprises a current sensing resistor connected in series with said main terminals of said semiconductor switch means, and a transistor having base drive voltage developed across said current sensing resistor to bias said transistor into conduction, said transistor being connected to said gate terminal of said semiconductor switch means such that conduction of said transistor lowers said gate drive bias for said semiconductor switch means;

a second stage protective subcircuit sensing current exceeding a given minimum current flow through said semiconductor switch means and an overvoltage across said semiconductor switch means indicating a probable faulty condition in said fuel pump, and turning OFF said semiconductor switch means, said second stage protective subcircuit comprises a second transistor having base drive voltage developed across said semiconductor switch means to bias said second transistor into conduction, and means sensing current flow through said semiconductor switch means and operatively coupled to said second transistor such that if the sensed current flow through said semiconductor switch means is above said minimum current flow then conduction of said second transistor turns OFF said semiconductor switch means;

a third stage protective subcircuit sensing long term increased current flow through said semiconductor switch means indicating a probable deteriorating condition in said fuel pump, and turning OFF said semiconductor switch means, said third stage protective subcircuit comprises a capacitor charged by current through said semiconductor switch means such that if said capacitor is charged above a given threshold voltage it turns OFF said semiconductor switch means;

said second and third protective subcircuits turn OFF said semiconductor switch means for a given cooling-off interval, after which said semiconductor switch means is automatically turned back ON.

9. The invention according to claim 8 comprising timer means triggered by said second stage protective subcircuit and turning OFF said semiconductor switch means for a given cooling-off interval after which said semiconductor switch means is automatically turned back ON, and wherein said timer means is also triggered by said third stage protective subcircuit and turns OFF said semiconductor switch means for a given cooling-off interval after which said semiconductor switch means is automatically turned back ON.

10. The invention according to claim 9 wherein:

said second stage protective subcircuit comprises a comparator having inverting and non-inverting inputs, one of said inputs being connected to said second transistor, the other of said inputs being connected to said semiconductor switch means, said comparator having an output connected to said timer means, such that said output triggers said timer means in response to a given overvoltage across said semiconductor switch means causing conduction of said second transistor as sensed by said one input of said comparator means if there is said minimum current flow through said semiconductor switch means as sensed by said other input of said comparator means;

said third stage protective subcircuit comprises a second comparator having inverting and noninverting inputs, one of said inputs of said second comparator being connected to said capacitor, the other of said inputs of said second comparator being connected to a given reference, said second comparator having an output connected to said timer means, such that said output of said second comparator triggers said timer means in response to said long term increased current flow through said semiconductor switch means charging said capacitor above said given threshold.

11. The invention according to claim 9 wherein:

said second stage protective subcircuit comprises a third transistor base driven into conduction by conduction of said second transistor, and a fourth transistor base driven into conduction by said minimum current flow through said semiconductor switch means, said third and fourth transistors being connected in series and completing a circuit to said timer means upon conduction of each of said third and fourth transistors, to trigger said timer means;

said third stage protective subcircuit comprises a fifth transistor base driven into conduction by said capacitor charged above said given threshold, conduction of said fifth transistor completing a circuit to said timer means, to trigger said timer means.

* * * * *